United States Patent [19]
Mokuo

[11] Patent Number: 6,022,185
[45] Date of Patent: *Feb. 8, 2000

[54] SUBSTRATE TRANSFERRING DEVICE

[75] Inventor: Shori Mokuo, Kumamoto-ken, Japan

[73] Assignees: Tokyo Electron Limited, Tokyo; Tokyo Electron Kyushu Limited, Tosu, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/761,520

[22] Filed: Dec. 9, 1996

Related U.S. Application Data

[63] Continuation of application No. 08/503,228, Jul. 17, 1995, abandoned, which is a continuation of application No. 08/106,631, Aug. 16, 1993, abandoned.

[30] Foreign Application Priority Data

Aug. 18, 1992 [JP] Japan ................................... 4-241239

[51] Int. Cl.[7] .................................................. B66C 23/00
[52] U.S. Cl. .............................. 414/744.6; 901/8; 901/15
[58] Field of Search ............................. 414/744.5, 744.6, 414/222; 74/490.01, 490.03, 490.04; 901/8, 15, 21

[56] References Cited

U.S. PATENT DOCUMENTS

| | | | |
|---|---|---|---|
| 4,483,654 | 11/1984 | Koche et al. | 414/744.5 |
| 4,728,252 | 3/1988 | Lada et al. | 414/744.5 |
| 5,083,896 | 1/1992 | Uehara et al. | 414/744.5 |
| 5,151,008 | 9/1992 | Ishida et al. | 74/479 BP X |
| 5,180,276 | 1/1993 | Hendrickson | 414/744.5 X |
| 5,333,986 | 8/1994 | Mizukami et al. | 901/21 X |
| 5,584,647 | 12/1996 | Uehara et al. | 414/744.5 |

FOREIGN PATENT DOCUMENTS

4-87785  3/1992  Japan .

*Primary Examiner*—Donald W. Underwood
*Attorney, Agent, or Firm*—Oblon, Spivak, McClelland, Maier & Neustadt, P.C.

[57] ABSTRACT

A substrate transferring device including a pair of support arms for supporting LCD substrates substantially horizontally, expandable multi-joint link mechanisms for moving the support arms in a horizontal plane, a first motor for extending and retracting the link mechanisms, a rotary base on which the link mechanisms are mounted, and a second motor for rotating the rotary base, wherein one of the support arms is provided so that an LCD substrate supported by the support arm is, at least partially, overlapped with an LCD substrate supported by the other support arm when the link mechanism is retracted.

9 Claims, 7 Drawing Sheets

SUBSTRATE TRANSFERRING DEVICE

This application is Continuation of application Ser. No. 08/503,228, filed on Jul. 17, 1995, now abandoned—which is a continuation application of Ser. No. 08/106,631 filed Aug. 16, 1993 also abandoned.

BACKGROUND OF THE INVENTION

1. Field of the Invention

The present invention relates to a device for transferring plural substrates such as a liquid crystal display (LCD) substrates and the like.

2. Description of the Related Art

LCD substrates, semiconductor wafers and others are etched, ashed, CVD-processed, sputtered and washed in the course of manufacturing LCDs or semiconductor devices. It is needed in this case that the speed at which the LCD substrates, for example, are processed is kept certain and high. A one-by-one system is thus employed instead of a batch system.

Generally, plural process chambers enclose a primary chamber (or load lock chamber) in system with the one-by-one type device. Substrate transferring means is arranged in the load lock chamber to transfer substrates one by one out of one of the process chambers into the load lock chamber or out of the load lock chamber into one of the process chambers.

Japanese Patent Disclosure Hei 4-87785 discloses a substrate process system provided with a load lock chamber in which two transferring means are arranged. This system enables the throughput to be enhanced but the two transferring means are arranged one upon the other in this case. Therefore, particles caused in the upper drive mechanism adhere to the substrate located below and contaminate it. In addition, the space which is occupied by the two transferring means is large. This makes the whole of the substrate transferring device large in size. This is contrary to today's need that the device for transferring LCD substrates must be made smaller in size.

SUMMARY OF THE INVENTION

The object of the present invention is therefore to provide a substrate transferring device, smaller in size, but capable of increasing the throughput and preventing particles from adhering to substrates.

According to an aspect of the present invention, there can be provided a substrate transferring device comprising plural support sections each for supporting a substrate substantially horizontal; link means for moving these substrates in a horizontal plane; first drive means for extending and retracting the link means; rotary base means on which the link means are mounted; and second drive means for rotating the rotary base means; wherein one of the support sections is provided so that a substrate supported by the support section is, at least partially, overlapped with a substrate supported by the other support section with a space there between when the link means is retracted.

According to the substrate transferring device of the present invention having the above-described arrangement, plural substrates can be carried in and out at the same time to thereby increase the throughput.

Further, first and second drive means are located under the substrates carried in and out. Particles can be thus prevented from adhering to the substrates. Therefore, they cannot be contaminated by particles and their quality cannot be degraded because of their being contaminated by particles.

Furthermore, the substrates supported on the substrate support sections can be held at least partly overlapped each other. The load lock chamber can be thus made smaller and this enables the whole of the substrate transferring device to be made smaller in size.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Substrate transferring devices according to the present invention will be described in detail with reference to the accompanying drawings. These substrate transferring devices will be applied to the LCD substrate etching process system in the following cases.

Figure 1:
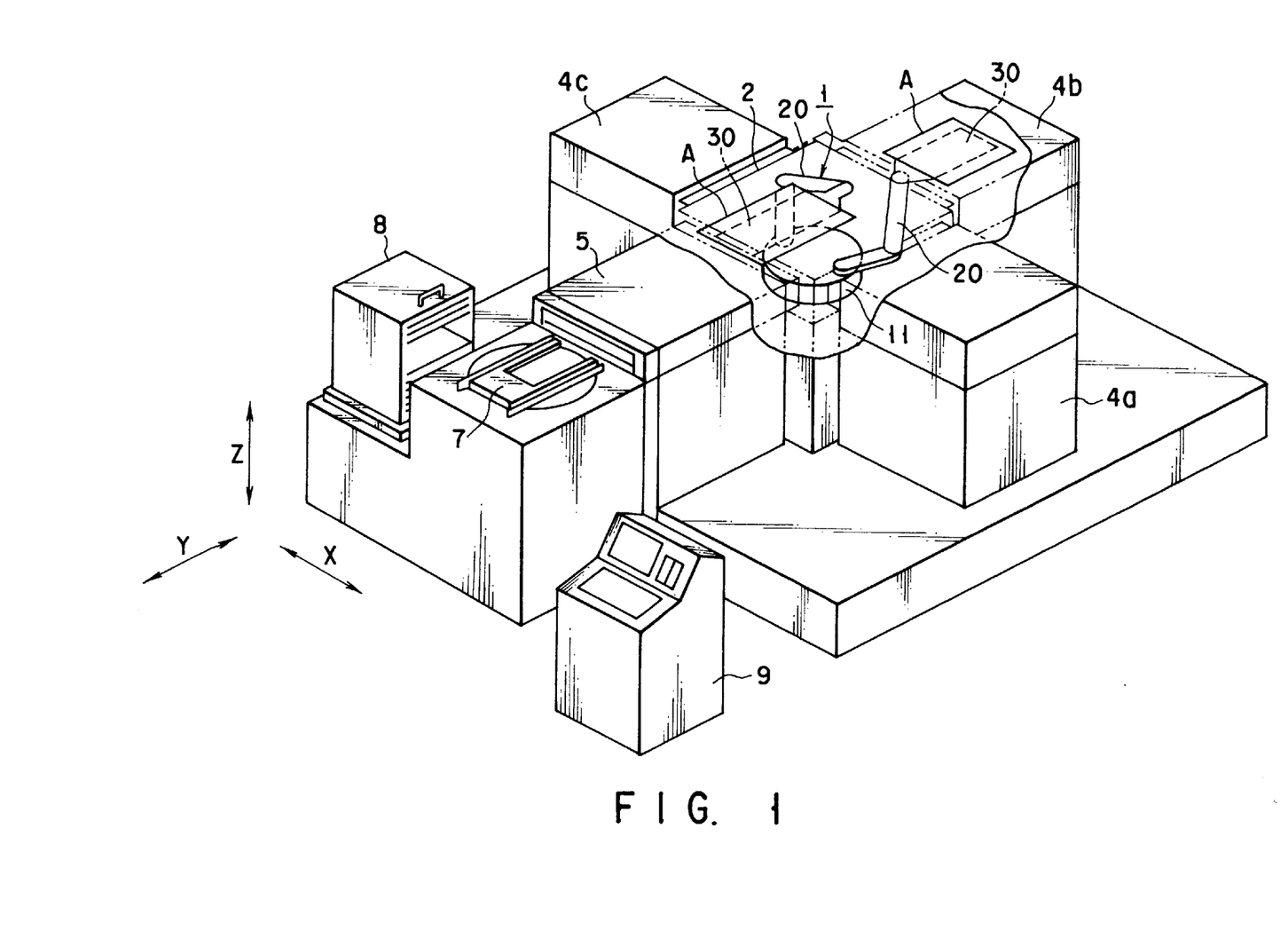
FIG. 1 is a perspective view schematically showing the whole of the LCD substrate process system into which a substrate transferring device according to the present invention is incorporated.
Figure 2:
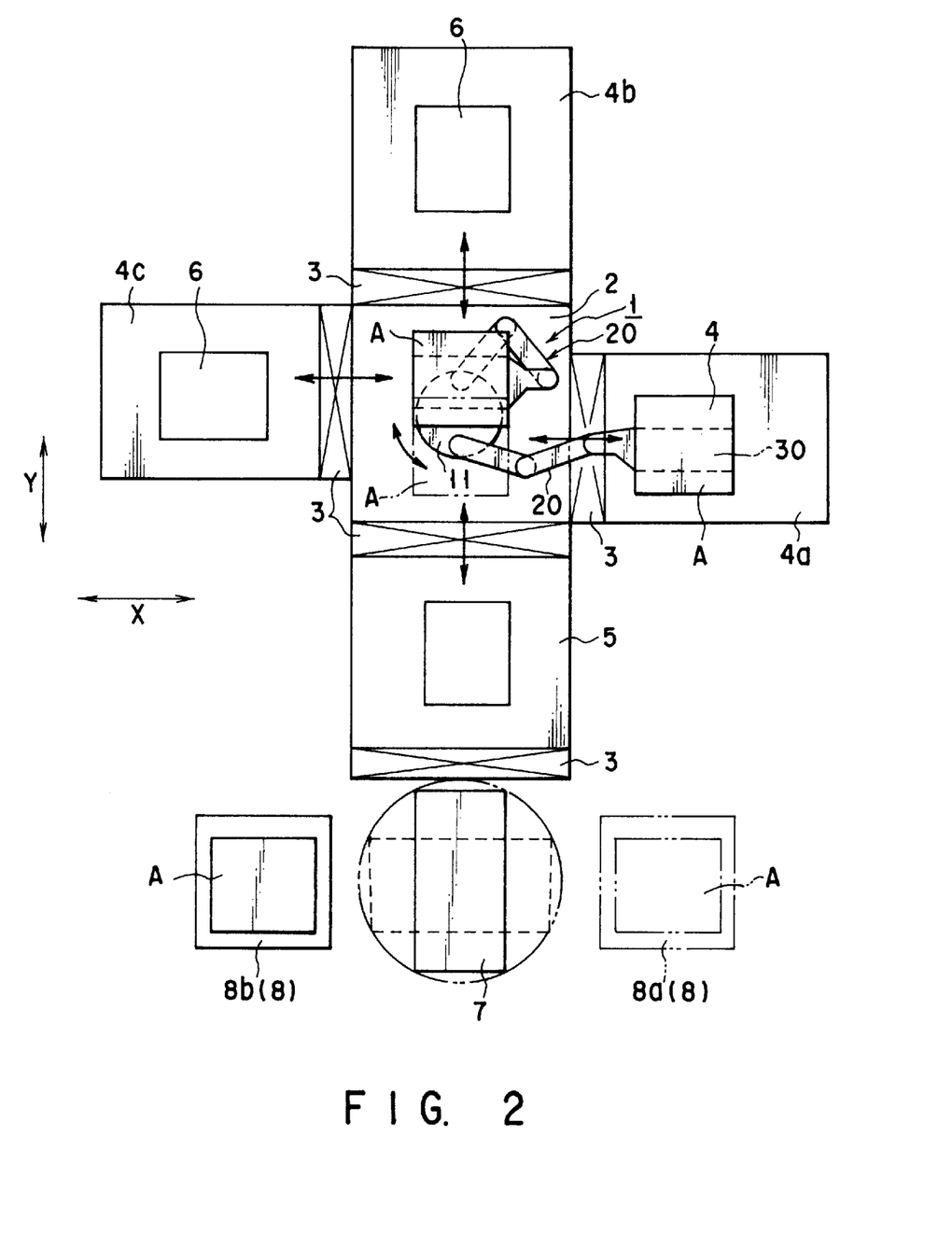
FIG. 2 is a plan showing the whole of the LCD substrate process system.

As shown in FIGS. 1 and 2, a first load lock chamber 2 is located in the center of the etching process system and three process chambers 4a, 4b, 4c and a second load lock chamber 5 enclose this first load lock chamber 2. Each of the process chambers 4a, 4b and 4c is connected to the load lock chamber 2 with gate valve 3 interposed between them. It can be communicated with the load lock chamber 2 when its corresponding gate valve 3 is opened. A stage 6 on which an LCD substrate A is mounted is arranged in each of the first, second and third process chambers 4a, 4b and 4c. An LCD substrate transferring device 1 is arranged in the first load lock chamber 2.

The second load lock chamber 5 is connected to the first load lock chamber 2 through the gate valve 3 and communicated with outside through another gate valve 3 located on the front side of it. A substrate transferring arm mechanism 7 is arranged in front of the chamber 5. Cassettes 8 in each of which a plurality sheets of substrates A are housed are arranged on both sides of the substrate carrying arm mechanism 7. Substrates A which are not processed yet are housed in the cassette 8a shown by two-dot and dash lines in FIG. 2 and those which have been processed in the cassette 8b shown by solid lines in FIG. 2.

A vacuum pump (not shown) is connected to each of the first, second load lock chambers 2, 5 and the first, second, third vacuum process chambers 4a, 4b, 4c through a valve (not shown). They can be thus exhausted to a predeterminedly depressurized atmosphere.

The substrate transferring device 1 in the first load lock chamber 2 will be described referring to FIGS. 3 through 7.

Figure 3:
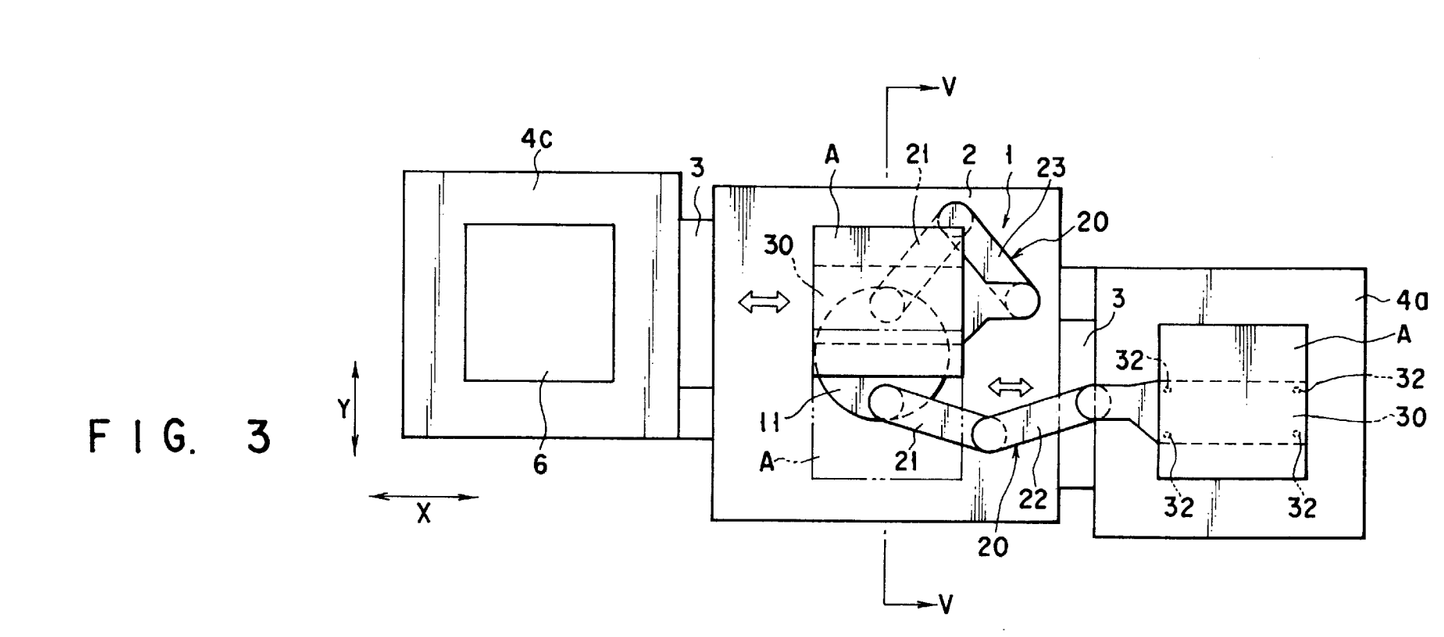
FIG. 3 is a plan showing the substrate transferring device according to a first embodiment of the present invention.
Figure 6:
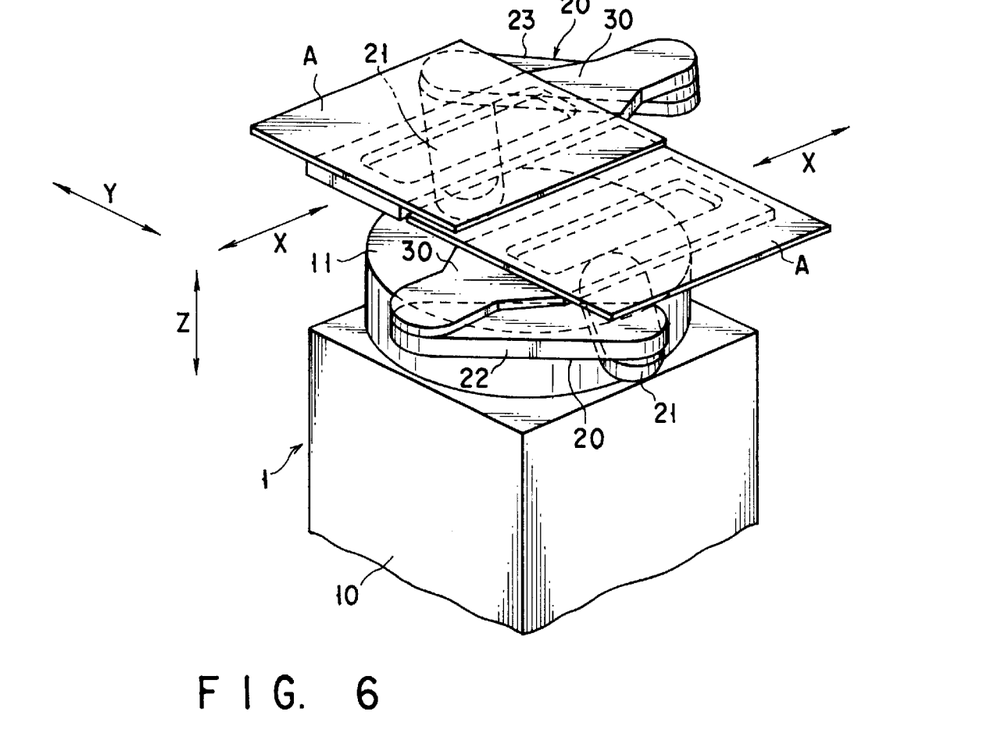
FIG. 6 is a perspective view showing the substrate transferring device.

As shown in FIGS. 3 and 6, the substrate transferring device 1 has two multi-joint expandable arms 20. Each of them is rotatably attached to a base 11 at the base portion thereof. A support arm 30 is attached to a front end of each of them. They can be extended straight along an axis X in reverse directions by 180°. Even when they are extended and retracted, the substrate A on each of their support arms can be carried on a straight line while being kept the same in posture.

Figure 7:
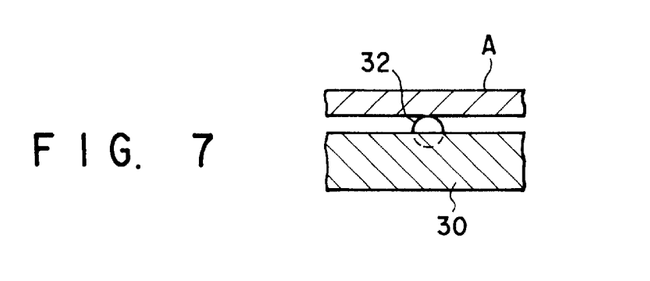
FIG. 7 is a sectional view showing an LCD substrate support enlarged.

As shown in FIG. 7, four support members 32 are projected from the top of the support arm 30 to support the substrate A thereon. Each of them is an O-ring made of soft resin.

Figure 4:
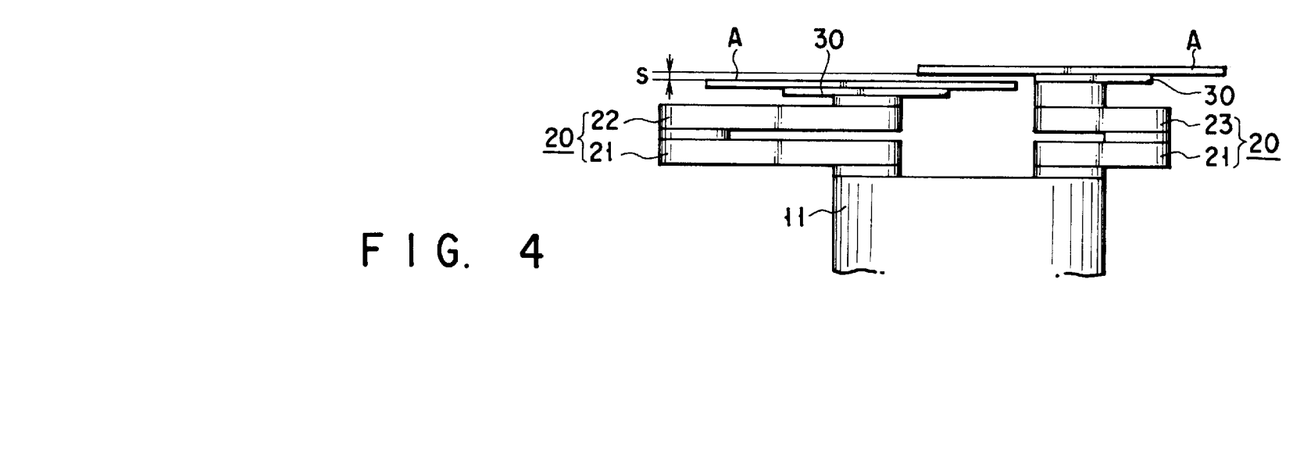
FIG. 4 is a side view showing the substrate transferring device.
Figure 5:
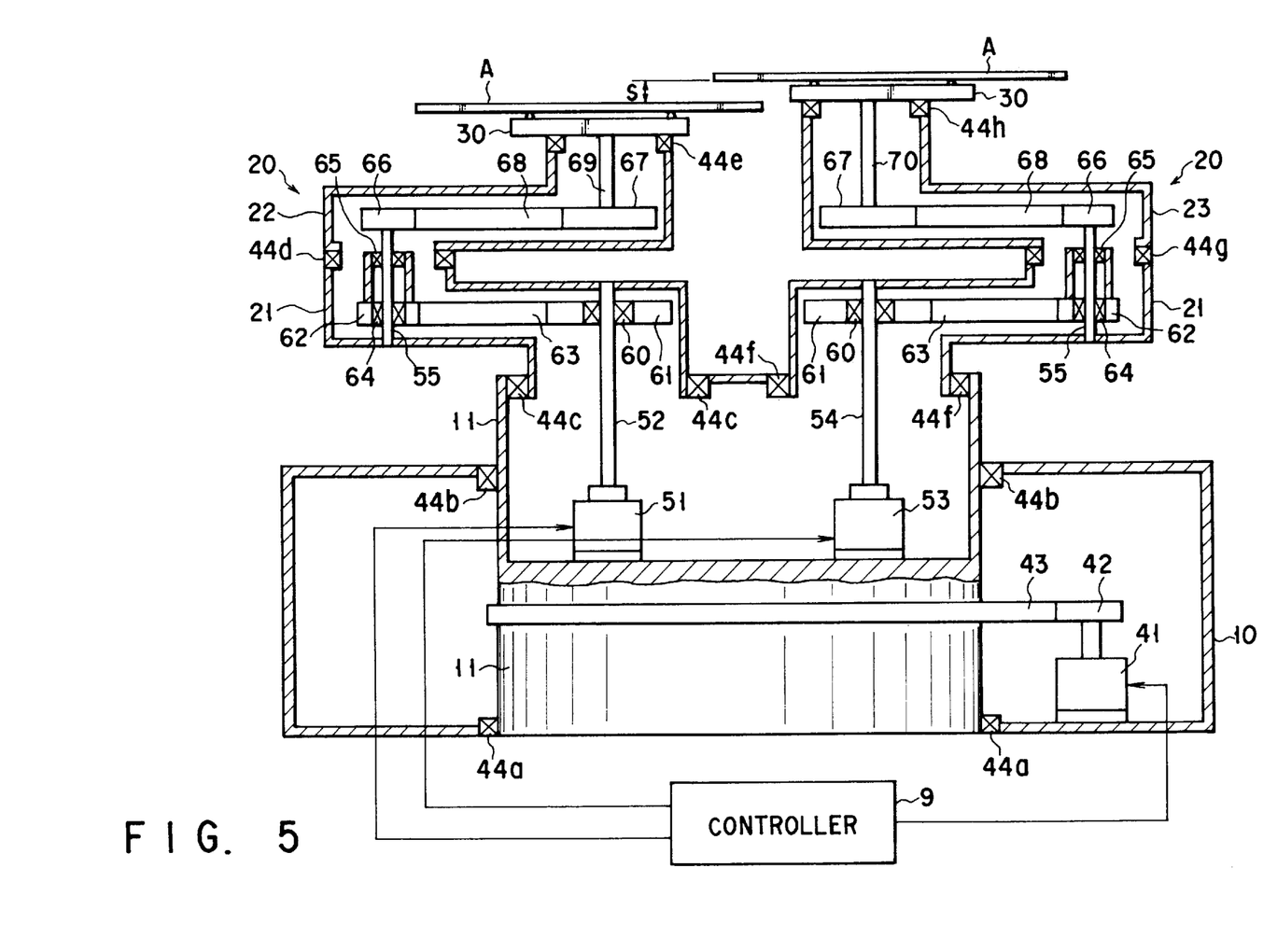
FIG. 5 is a block diagram showing how the substrate transferring device is arranged in the inside thereof.

As shown in FIGS. 4 and 5, when both of the expandable arm mechanisms 20 are retracted, the substrate A on the support arm 30 of one expandable arm mechanism 20 is partly overlapped the substrate A above the support arm 30 of the other expandable arm mechanism 20. One support arm 30 is different from the other support arm 30 in height. In short, the substrate A on one support arm 30 is separated from the substrate A on the other support arm 30 by a distance S, so that both of the substrates A cannot interfere with each other. This enables the substrates A to be mounted and supported on both of the support arms 30 at the same time. The whole of the substrate transferring device 1 is supported, movable up and down, by an elevator mechanism (not shown).

Referring to FIG. 5, it will be described how the substrate transferring device 1 is arranged in the inside thereof.

A base 10 is fixed to the frame of the chamber 2. The rotating base 11 is inserted into a center opening of the fixed base 10 and supported by a pair of bearings 44a and 44b. A belt 43 is stretched between the rotating base 11 and a pulley 42 and the rotating base 11 is rotated by a motor 41. A gear mechanism may be used, instead of the pulley 42 and the belt 43, to rotate the rotating base 11.

The top of the rotating base 11 is projected above from the top of the fixed base 10. A pair of the multijoint expandable arm mechanisms 20 are attached to the top of the rotating base 11. Two motors 51 and 53 are arranged in the rotating base 11 and one arm mechanism 20 is extended and retracted by the first motor 51 and the other by the second motor 53.

These first and second expandable arm mechanisms 20 are substantially symmetrical to each other but their support arms 30 are different in height.

A drive shaft 52 of the motor 51 is extended upward and fixed to a first case 21 of the first expandable arm 20 at the top thereof. The bottom end of this first case 21 is rotatably supported by the rotating base 11 through a bearing 44c and the top end thereof is rotatably connected to a second case 22 through a bearing 44d. A belt 63 and pulleys 61, 62 are housed in the first case 21. A belt 68 and pulleys 66, 67 are housed in the second case 22. The pulley 61 is attached to the motor drive shaft 52 through a bearing 52 and the pulley 62 to a shaft 55 through a pair of bearings 64 and 65. The bottom end of the shaft 55 is fixed to the first case 21. The pulley 66 is attached to the top end of the shaft 55. The belt 68 is stretched between the pulleys 66 and 67. The pulley 67 is connected to the support arm 30 through a shaft 69. The support arm 30 is attached to the top of the second case 22 through a bearing 44e.

The vertically-erected top end portion of a second case 23 of the second expandable arm mechanism 20 is longer than that of the second case 22 of the first expandable arm mechanism 20. In addition, a shaft 70 is longer than the shaft 69. The second support arm 30 is thus made higher than the first one 30 by the level difference S.

The motors 41, 51 and 53 are drive-controlled by controller 9. Each of the rotating base 11, cases 21, 22, 23 and support arms 30 is made by an aluminium or stainless steel plate. Each of the belts 43, 63, 68 and pulleys 42, 61, 62, 66, 67 is made of stainless steel coated fluorine system resin.

As shown in FIG. 6, each of the support arms 30 is shaped like a rectangular plate and the center portion of the plate is cut away to make the support arm 30 light in weight.

Figure 8:
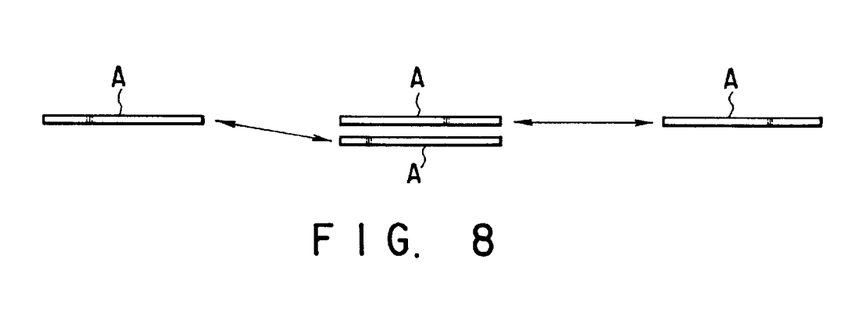
FIG. 8 is a side view showing LCD substrates carried in and out.

As shown in FIG. 8, the first expandable arm mechanism 20 is a little tilted relative to the horizontal plane. One substrate A (which is carried by the first expandable arm mechanism 20) can be thus positioned lower than the other substrate A (which is carried by the second expandable arm mechanism 20) in the first load lock chamber 2. In other words, both of the substrates A can be kept at a same level when the first expandable arm mechanism 20 is extended, but they can be kept at different levels when it is retracted. This enables the substrates A to be kept at a same level in the process chambers 4a–4c and second load lock chamber 5, thereby making it unnecessary to adjust the level of any substrate A at the substrate transferring-in and-out times.

Although each support arm 30 has been shaped like rectangular plate in the above-described first embodiment, it may be divided like a fork. Further, a pair of holder members may be arranged on each support arm 30, on which the substrate A is mounted, to hold the substrate A between them.

Referring to FIG. 2, it will be described how the substrate transferring device is operated.

The first, second load lock chambers 2, 5 and the first, second, third process chambers 4a, 4b, 4c are depressurized to a predetermined value. A substrate A which is not processed yet is picked up from the cassette 8a and carried into the second load lock chamber 5 by the substrate transferring arm mechanism 7. The substrate A which has been carried into the second load lock chamber 5 is kept under the depressurized state when the gate valve 3 located in front of the second load lock chamber 5 is closed.

The gate valve 3 between the first 2 and the second load lock chamber 5 is then opened and the first expandable arm mechanism 20 is extended from the substrate transferring device 1 which has been rotated to its substrate receiving position. After the substrate A is received by the support arm 30, the expandable arm mechanism 20 is retracted to transfer the substrate A into the first load lock chamber 2.

The second expandable arm mechanism 20 then conducts the same behavior to transfer another substrate A into the first load lock chamber 2. Both of the substrates A are partly overlapped in this case but they do not interfere with each other because the clearance S is present between them. When the substrates A are carried into the first load lock chamber 2 in this manner, the gate valve 3 between the first load lock chamber 2 and the second load lock chamber 5 is closed.

The rotating base 11 is rotated by 90 degrees and then stopped. The gate valve 3 of the first vacuum process chamber 4a is opened under this state. The first expandable arm mechanism 20 is extended to transfer the substrate A into the first process chamber 4a. The substrate A is mounted on the substrate-mounted stage 6 in the first vacuum process chamber 4a (see FIG. 3) and the expandable arm mechanism 20 is then shrunk to its original position. The gate valve 3 of the first process chamber 4a is closed and the substrate A is etching-processed in the first vacuum process chamber 4a. While the substrate A is being etching-processed in the first vacuum process chamber 4a, the gate valve 3 of the third vacuum process chamber 4c is opened. The second expandable arm 20 is extended to transfer the other substrate A into the third vacuum process chamber 4c and mount it on the substrate-mounted stage 6 in the chamber 4c. The second arm mechanism, 20 is then retracted to its original or home position. The gate valve 3 of the third vacuum process chamber 4c is closed and the substrate A is etching-processed in the chamber 4c.

After etching process is applied to the substrates A in the vacuum process chambers 4a and 4c, the gate valve 3 of the first vacuum process chamber 4a is opened. The first expandable arm mechanism 20 is extended to hold the substrate A on its support arm 30 in the first vacuum process chamber 4a. It is then retracted to transfer the substrate A out of the first vacuum process chamber 4a. After the substrate A is carried out in this manner, the gate valve 3 of the first vacuum process chamber 4a is closed. The gate valve 3 of the third vacuum process chamber 4c is then opened and the second expandable arm mechanism 20 is extended to similarly transfer the other substrate A out of the third vacuum process chamber 4c.

The substrates A carried out of the first and third vacuum process chambers 4a and 4c are carried into the second load lock chamber 5 by the substrate transferring-out operation of the substrate transferring device 1 which is reverse to its substrate transferring-in operation. The substrates A are then carried, as having been processed, into the cassette 8b by the substrate transferring arm mechanism 7. The processing of the substrates A is thus finished.

Although the substrate transferring device of the present invention has been applied to the etching process system in the above case, it can also be applied to the ashing or CVD apparatus which has load lock and process chambers in the same way.

Figure 9:
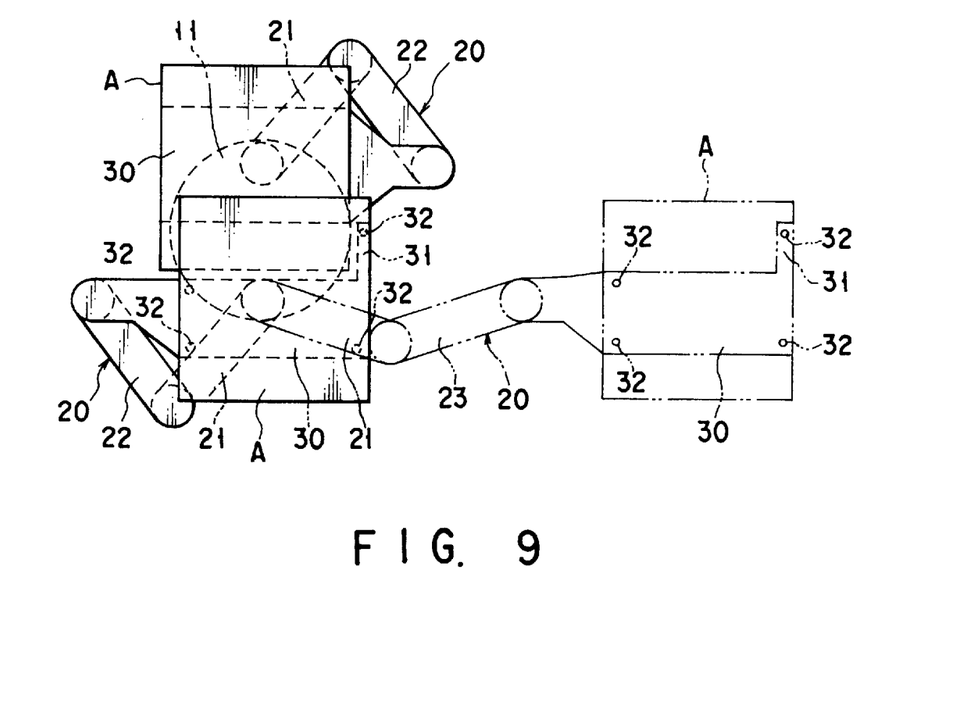
FIG. 9 is a plan showing the substrate transferring device according to a second embodiment of the present invention.

The substrate transferring device according to a second embodiment of the present invention will be described with reference to FIG. 9. Description on same components as those of the first embodiment will be made only when needed.

The shape of the support arm 30 is changed in the second substrate transferring device to make smaller the space which is occupied by the device. More specifically, the second support arm 30 is made narrower than the first one to make it possible for the substrates A to be overlapped to a greater extent when the arm mechanisms 20 are retracted. An auxiliary piece 31 is extended sideward from the front end of the second support arm 30 in this case to stably support the substrate A on the arm 30.

The second substrate transferring device can be made smaller in size, as compared with the first one.

Figure 10:
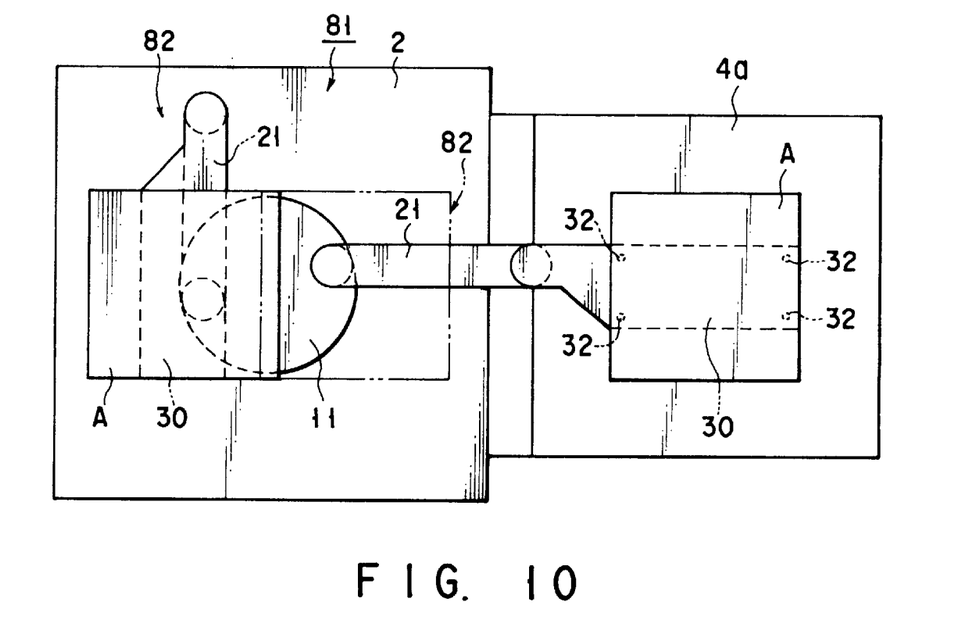
FIG. 10 is a plan showing the substrate transferring device according to a third embodiment of the present invention.
Figure 11:
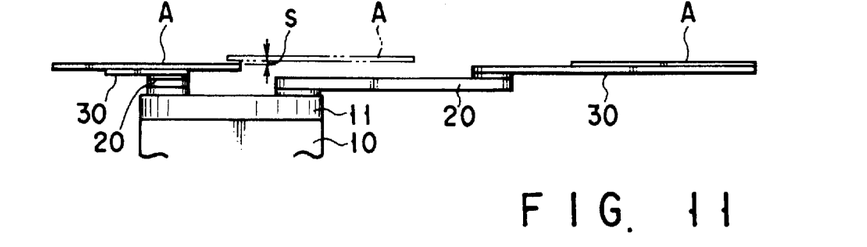
FIG. 11 is a side view showing the third substrate transferring device.

The substrate transferring device according to a third embodiment of the present invention will be described referring to FIGS. 10 and 11. Description on same components as those of the first embodiment will be made only when needed.

In the case of this third substrate transferring device 81, each expandable multi-joint arm mechanism 82 is made simpler in structure to make the device 81 smaller in size. In short, each support arm 30 is connected directly to the first case 21 to make the expandable arm mechanism 82 shorter. The device 81 can be thus made smaller in size. In the case of this device 81, however, the direction of the substrate A on the support arm 30 of each expandable arm mechanism 82 is changed by 90° when the arm mechanism 82 changes its state from its being extended to its being retracted or vice versa. When the substrate A are to be carried in or out, therefore, the rotating base 11 must be rotated by 90° and both of the substrates A must be directed in a right direction.

According to the third substrate transferring device 81, it can be made simpler in structure, lower in cost and smaller in size. In addition, the space occupied by it can be made smaller.

Figure 12:
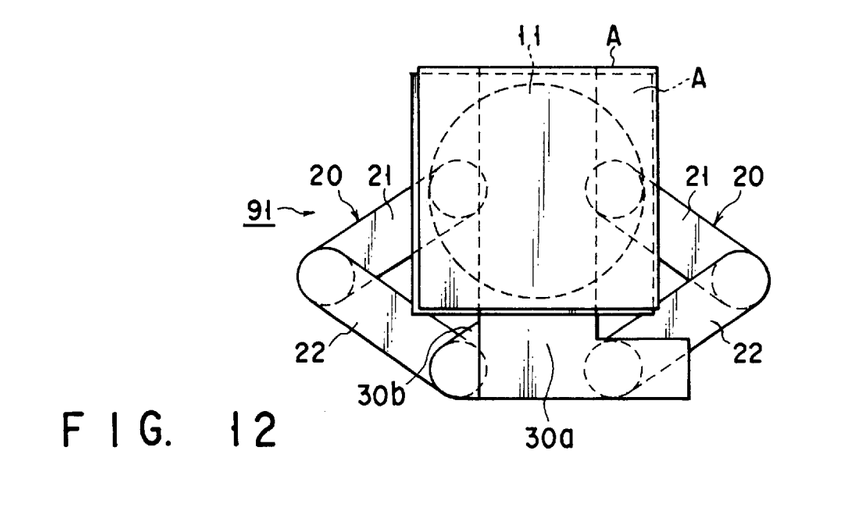
FIG. 12 is a plan showing the substrate transferring device according to a fourth embodiment of the present invention.
Figure 13:
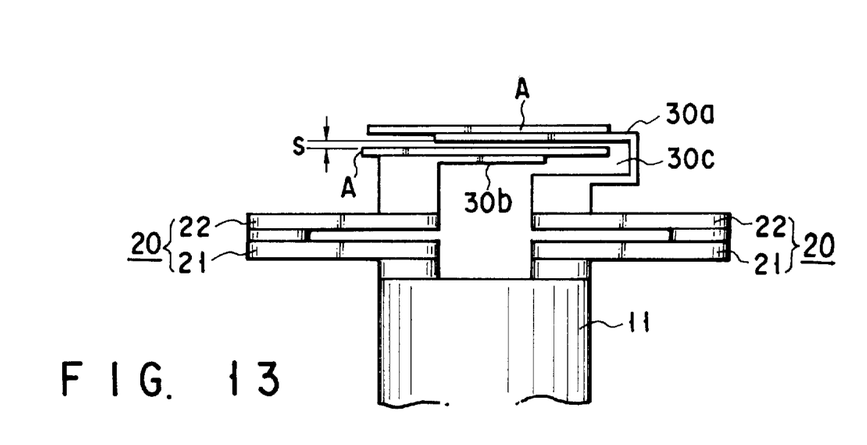
FIG. 13 is a side view showing the fourth substrate transferring device.

The substrate transferring device according to a fourth embodiment of the present invention will be described with reference to FIGS. 12 and 13. Description on same components as those of the first embodiment will be made only when needed.

In the case of a fourth substrate transferring device 91, the space exclusively occupied by the device 91 can be made by far smaller, as compared with the third device 81. The base portion of a first support arm 30a is shaped like a fallen U and when the first arm mechanism 20 is shrunk, therefore, a second support arm 30b and the substrate A on it can be thus housed in this fallen-U-shaped recess of the first support arm 30a. The substrate A on the first support arm 30a can be overlapped all over the other substrate A on the second support arm 30b in this case and a clearance S is formed between the bottom of the first support arm 30a and the top of the substrate A on the second support arm 30b.

According to the fourth substrate transferring device 91, the substrate A on the first support arm 30a can be overlapped all over the other substrate A on the second support arm 30b. The device 91 can be thus made smaller in size when viewed in the horizontal plane. This enables the whole of the device 91 to be made smaller in size and the space exclusively occupied by the device 91 to be made smaller.

According to the present invention as described above, the following merits can be achieved.

Plural transferring mechanisms and substrate supports are provided on the rotating mechanism. Plural substrates can be thus carried in and out at the same time, thereby enabling the throughput to be enhanced.

The drive means are arranged below the substrates carried. Particles caused at the drive section can be thus prevented from adhering to the substrates. This prevents the substrates from being contaminated and degraded by particles.

The substrates on the support arms are overlapped each other with a clearance interposed between them. The whole of the device can be thus made smaller in size to more efficiently use the space.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A substrate transferring device, disposed within a chamber whose inner atmosphere can be controlled, comprising:

substantially rectangular first and second LCD substrates which are transferred into and out of said chamber;

first and second substrate support sections, each for supporting one of the respective first and second LCD substrates one by one such that a main surface of each respective LCD substrate is held substantially horizontal, said first and second substrate support sections not overlapping with each other at a home position in said chamber, said first and second substrate support sections being at different height levels at the home position in said chamber;

a first link arm connected to the first substrate support section such that the first substrate supported by the first substrate support section is moved to extend a first direction in a horizontal plane;

a second link arm connected to the second substrate support section such that the second substrate supported by the second substrate support section is moved to extend a second direction in a horizontal plane, said second direction being different from said first direction;

a first drive motor for extending and retracting the firs link arm;

a second drive motor for extending and retracting the second link arm;

a rotary base on which the first and second link arms and the first and second drive motors are mounted;

a third drive motor for rotating the rotary base; and a controller for controlling each of the first, second and third drive motors;

wherein when the first and second link arms are moved into the home position in the chamber to cause the first substrate support section to be moved toward the second support section, at least a portion of the main surface of the first LCD substrate supported by the first substrate support section is allowed to overlap with at least a portion of the second LCD substrate supported by the second substrate support section, and a longer side of the first LCD substrate supported by the first substrate support section is aligned in a same direction with a longer side of the second LCD substrate supported by the second substrate support section.

2. The device according to claim 1, further comprising an auxiliary member for stably supporting a substrate, said auxiliary member attached to one of said plurality of support sections.

3. The device according to claim 1, wherein each link arm comprises a case and a belt mechanism.

4. The device according to claim 1, wherein each link arm has an expandable three-joint arm.

5. The device according to claim 1, wherein each link arm has an expandable two-joint arm.

6. The device according to claim 1, wherein each of said first and second substrate support sections has a supporting area smaller than a main surface of the first and second substrates and, when said first link arm is retracted to cause said first substrate support section to approach said second substrate support section, the overlapping portion of the first substrate which is supported by said first substrate support section is positioned outside of said supporting area of said second substrate support section and partially overlaps with the overlapping portion of the second substrate which is supported by said second substrate support section which is positioned outside of said supporting area of said first substrate support section, with a space provided between the overlapping portions of the first and second substrates.

7. A device according to claim 1, wherein each of the first and second link arms has three joints.

8. A device according to claim 1, wherein each of the first and second link arms has two joints.

9. A device according to claim 1, wherein said first and second substrate support sections are smaller than said first and second substrates.

* * * * *

UNITED STATES PATENT AND TRADEMARK OFFICE
CERTIFICATE OF CORRECTION

PATENT NO.   : 6,022,185
DATED        : February 8, 2000
INVENTOR(S)  : Mokuo

It is certified that error appears in the above-identified patent and that said Letters Patent is hereby corrected as shown below:

Title page,
Item [73], the Assignee information is incorrect. Item [73] should read as follows:
-- [73] Assignee: Tokyo Electron Limited, Tokyo, Japan --

Signed and Sealed this

Twenty fifth Day of September, 2001

Attest:

NICHOLAS P. GODICI
Attesting Officer
Acting Director of the United States Patent and Trademark Office